(12) United States Patent
Holihan et al.

(10) Patent No.: US 10,962,335 B2
(45) Date of Patent: Mar. 30, 2021

(54) DIRECTED ENERGY DELIVERY SYSTEMS CAPABLE OF DISRUPTING AIR-BASED PREDATORY THREATS

(71) Applicant: Raytheon Company, Waltham, MA (US)

(72) Inventors: Michael J. Holihan, Santa Clarita, CA (US); Michael C. Prescott, Redondo Beach, CA (US); David D. Crouch, Eastvale, CA (US); David R. Sar, Corona, CA (US); Thomas L. Obert, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 220 days.

(21) Appl. No.: 16/100,749

(22) Filed: Aug. 10, 2018

(65) Prior Publication Data

US 2019/0120600 A1    Apr. 25, 2019

Related U.S. Application Data

(60) Provisional application No. 62/571,133, filed on Oct. 11, 2017.

(51) Int. Cl.
*F41H 11/02* (2006.01)
*F41H 13/00* (2006.01)
(Continued)

(52) U.S. Cl.
CPC ......... *F41H 11/02* (2013.01); *F41H 13/0093* (2013.01); *H04K 3/62* (2013.01);
(Continued)

(58) Field of Classification Search
CPC .................................. H05H 1/54; F41H 11/02
See application file for complete search history.

(56) References Cited

U.S. PATENT DOCUMENTS 4,109,883 A * 8/1978 Korr .................. F41B 6/00
244/3.1
4,817,495 A * 4/1989 Drobot ................ F41H 11/02
250/358.1
(Continued)

FOREIGN PATENT DOCUMENTS

FR         2783316 A1     3/2000
WO    WO2016/193722 A1 * 12/2016 .............. F42B 12/36

OTHER PUBLICATIONS

Wikipedia, entry for the term, LC Circuit. Retrived from the Internet on May 19, 2020. (Year: 2020).*
(Continued)

*Primary Examiner* — Bernarr E Gregory

(57) ABSTRACT

An apparatus includes a capsule configured to be launched or carried towards an unmanned aerial vehicle (UAV). The apparatus also includes a directed energy device within or carried by the capsule. The directed energy device includes a first inductor configured to generate an inductive magnetic field that is able to inductively couple into one or more electronics of the UAV in order to disable or destabilize the UAV. The capsule can be configured to be launched towards the UAV and can include a loiter mechanism (such as a rotor, umbrella, or parachute) configured to maintain a position of the capsule or to slow a descent of the capsule after launch. The capsule can also be configured to be carried towards the UAV by a different UAV, and the apparatus can further include a tether coupling the capsule to the different UAV.

21 Claims, 6 Drawing Sheets

(51) Int. Cl.
*H04K 3/00* (2006.01)
*H03H 5/02* (2006.01)
*H03K 17/687* (2006.01)
*F41H 11/00* (2006.01)

(52) U.S. Cl.
CPC ............... *H04K 3/825* (2013.01); *H03H 5/02* (2013.01); *H03K 17/687* (2013.01); *H04K 3/90* (2013.01); *H04K 3/92* (2013.01); *H04K 2203/22* (2013.01)

(56) References Cited

U.S. PATENT DOCUMENTS

| | | | | |
|---|---|---|---|---|
| 5,059,839 | A * | 10/1991 | Rose | F42B 12/36 310/10 |
| 5,192,827 | A | 3/1993 | Jasper | |
| 5,251,550 | A * | 10/1993 | Grossler | F42B 12/36 102/293 |
| 5,645,137 | A * | 7/1997 | Pacholok | B60R 25/00 180/287 |
| 5,835,545 | A * | 11/1998 | Turchi | H05H 1/54 376/145 |
| 6,679,179 | B1 * | 1/2004 | Bohl | F41H 13/0093 102/210 |
| 7,071,631 | B2 * | 7/2006 | Howard, II | G21K 1/00 307/108 |
| 7,475,624 | B1 * | 1/2009 | Daily | F41H 13/0093 180/167 |
| 7,629,918 | B2 * | 12/2009 | Brown | F41H 13/0043 342/13 |
| 7,775,146 | B1 * | 8/2010 | Bitar | F41H 11/12 102/403 |
| 9,500,446 | B2 | 11/2016 | Crouch et al. | |
| 9,689,976 | B2 | 6/2017 | Parker et al. | |
| 2008/0156219 | A1 * | 7/2008 | Voss | F41H 11/16 102/402 |
| 2010/0018428 | A1 * | 1/2010 | Regebro | F42B 12/36 102/364 |
| 2010/0181424 | A1 | 7/2010 | Goossen et al. | |
| 2010/0295717 | A1 * | 11/2010 | Rourk | F41H 13/0068 342/13 |
| 2011/0203476 | A1 * | 8/2011 | Smogitel | F42B 12/36 102/501 |
| 2017/0191804 | A1 | 7/2017 | Stark et al. | |
| 2017/0253348 | A1 | 9/2017 | Ashdown et al. | |
| 2017/0261292 | A1 | 9/2017 | Armstrong et al. | |

OTHER PUBLICATIONS

H. Pender et al, "Electrical Engineers' Handbook"; vol. V, "Electric Communication and Electronics"; p. 7-158; Figure 4 and section entitled, "Typical Tank Circuits; Harmonic Discrimination"; John Wiley and Sons, Inc.; New York, NY, USA; 1936. (Year: 1936).*
Ackerman, "Raytheon Sets Phasers to Drone Destruction with Directed Energy Weapon Test," IEEE Spectrum, Nov. 2016, 2 pages.
Battelle, "DroneDefender," Brochure ID 510, Battelle Memorial Institute, Mar. 2017, 2 pages.
Federal Aviation Administration, "FAA Expands Drone Detection Pathfinder Initiative," Jul. 2016, 2 pages.
Lewis, "Raytheon EMP weapon tested by Boeing, USAF Research Lab," MMXVII Military Embedded Systems, Nov. 2012, 2 pages.
"Skywall—Capture Drones—Protect Assets," OpenWorks Engineering Ltd., Dec. 2016, 15 pages.
Gibbs, "The Guardian," OpenWorks Engineering Ltd., Mar. 2016, 3 pages.
Patel et al., "What is India's secret EMP weapon KALI 5000?," www.quora.com, Mar. 2015, 8 pages.
Prabhu, "Build your own mini-EMP generator and disrupt electronic gadgets," TechWorm, Jul. 2016, 5 pages.
Zhang, "This Rifle Shoots Down Drones with Radio Waves," www.petapixel.com, Oct. 2015, 12 pages.
Notification of Transmittal of the International Search Report and the Written Opinion of the International Searching Authority, or the Declaration dated Oct. 30, 2018 in connection with International Patent Application No. PCT/US2018/046242, 13 pages.

* cited by examiner

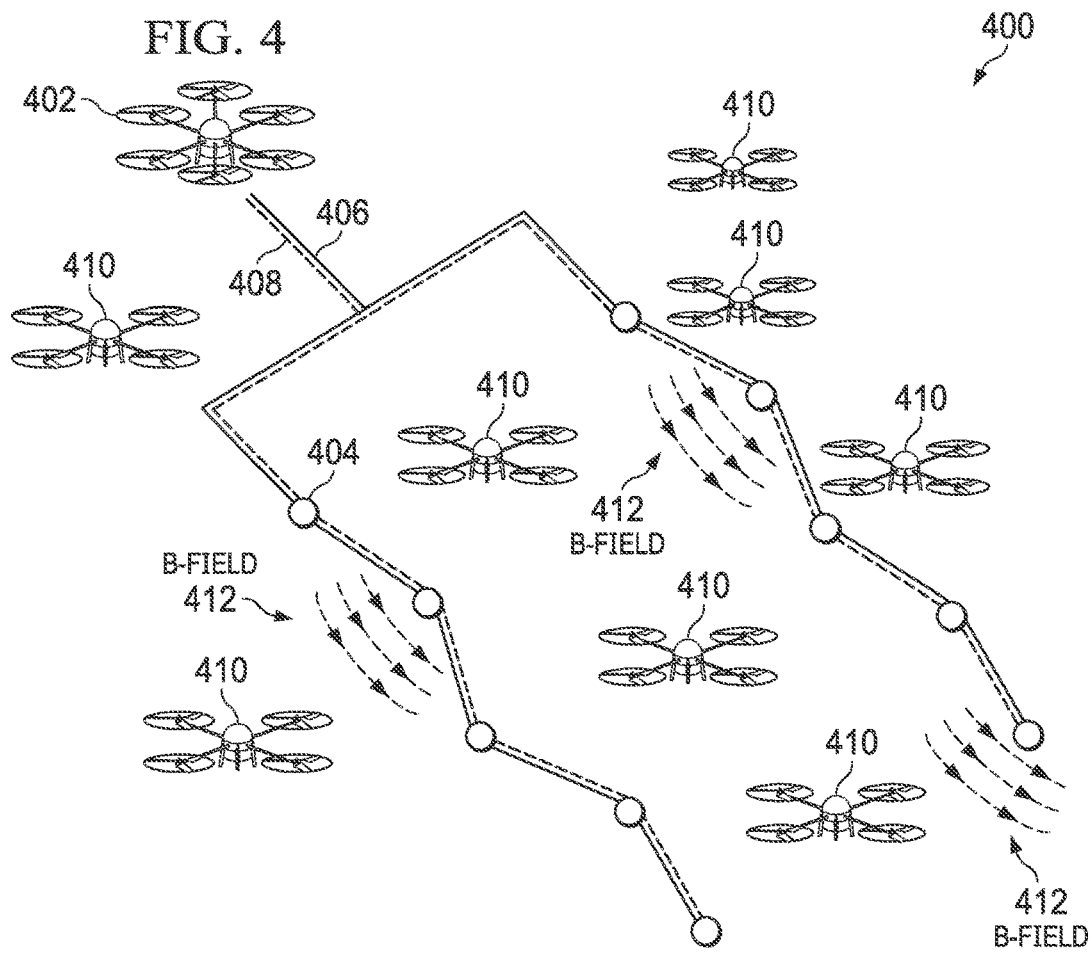
FIG. 4
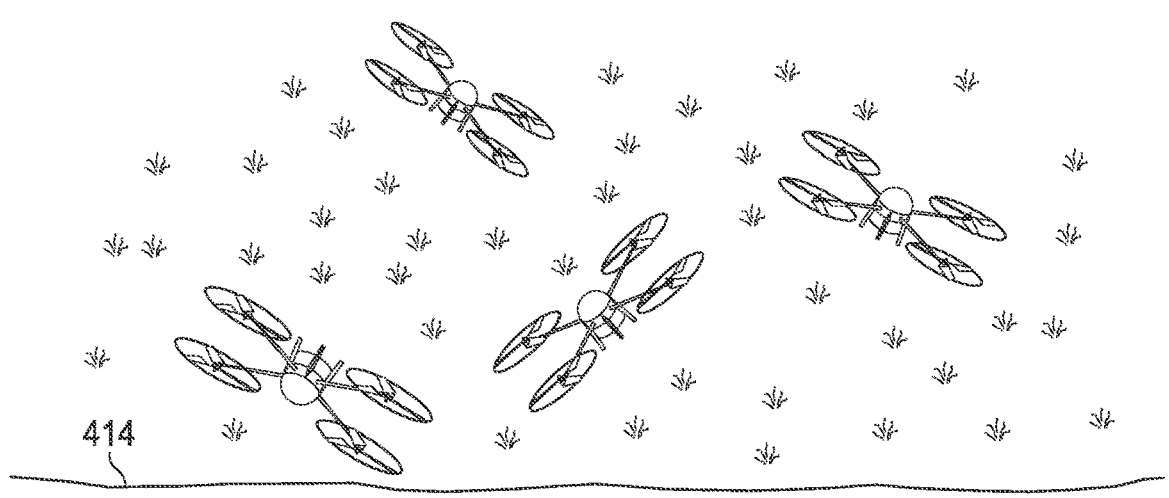

US 10,962,335 B2

DIRECTED ENERGY DELIVERY SYSTEMS CAPABLE OF DISRUPTING AIR-BASED PREDATORY THREATS

CROSS-REFERENCE TO RELATED APPLICATION AND PRIORITY CLAIM

This application claims priority under 35 U.S.C. § 119(e) to U.S. Provisional Patent Application No. 62/571,133 filed on Oct. 11, 2017. This provisional application is hereby incorporated by reference in its entirety.

TECHNICAL FIELD

This disclosure generally relates to protective or defensive systems. More specifically, this disclosure relates to directed energy delivery systems capable of disrupting air-based predatory threats.

BACKGROUND

Unmanned aerial vehicles (UAVs) come in a variety of shapes and sizes and include devices such as remote-controlled drones, airplanes, and helicopters. While UAVs have been used for a variety of entertainment, commercial, and military purposes, UAVs can be used for more nefarious purposes. For example, various governmental agencies have recognized that UAVs can pose threats to infrastructures such as subways, airports, sport gatherings, soft targets, military sites, power generating sites, and other locations. This is because UAVs provide an easy and inexpensive way for delivering threat payloads, such as radiological agents, plastic explosives or dynamite, nerve agents, or toxic biological agents like anthrax. These types of threats are expected to increase in number as the technical capabilities and commercial availability of UAVs improve. To make matters worse, swarms of UAVs under the control of a single attacker or a group of attackers can exponentially increase the odds of a successful attack against a location.

Conventional approaches for combatting rogue UAVs fall short in a number of ways. For example, nets can be used to physically capture UAVs, but the nets can be bulky and difficult to deliver at higher altitudes. Radio frequency (RF) jamming devices can be used to interrupt communications with UAVs, but they are often high power, expensive, and stationary and affect the functionality of other nearby electronic devices and systems. Hacking and redirecting UAVs can be effective but can require an undesirable amount of time to occur and can only disable one UAV at a time. Trained eagles have even been used to capture small UAVs that pose public safety hazards, but this approach is not implemented easily on a large scale.

SUMMARY

This disclosure provides directed energy delivery systems capable of disrupting air-based predatory threats.

In a first embodiment, an apparatus includes a capsule configured to be launched or carried towards an unmanned aerial vehicle (UAV). The apparatus also includes a directed energy device within or carried by the capsule. The directed energy device includes a first inductor configured to generate an inductive magnetic field that is able to inductively couple into one or more electronics of the UAV in order to disable or destabilize the UAV.

In a second embodiment, a system includes a plurality of apparatuses each having a capsule configured to be launched towards a UAV and a directed energy device within or carried by the capsule. The directed energy device includes a first inductor configured to generate an inductive magnetic field that is able to inductively couple into one or more electronics of the UAV in order to disable or destabilize the UAV. The system also includes a launcher configured to launch the capsules, where the launcher includes a tube.

In a third embodiment, a system includes a first UAV and one or more apparatuses each having a capsule configured to be carried by the first UAV towards a second UAV and a directed energy device within or carried by the capsule. The directed energy device includes a first inductor configured to generate an inductive magnetic field that is able to inductively couple into one or more electronics of the second UAV in order to disable or destabilize the second UAV.

In a fourth embodiment, a method includes moving a directed energy device towards a UAV and generating an inductive magnetic field using a first inductor of the directed energy device. The inductive magnetic field is able to inductively couple into one or more electronics of the UAV in order to disable or destabilize the UAV.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIG. 4 illustrates a third example environment where a directed energy device capable of disrupting air-based predatory threats can be used in accordance with this disclosure;

DETAILED DESCRIPTION

Figure 1:
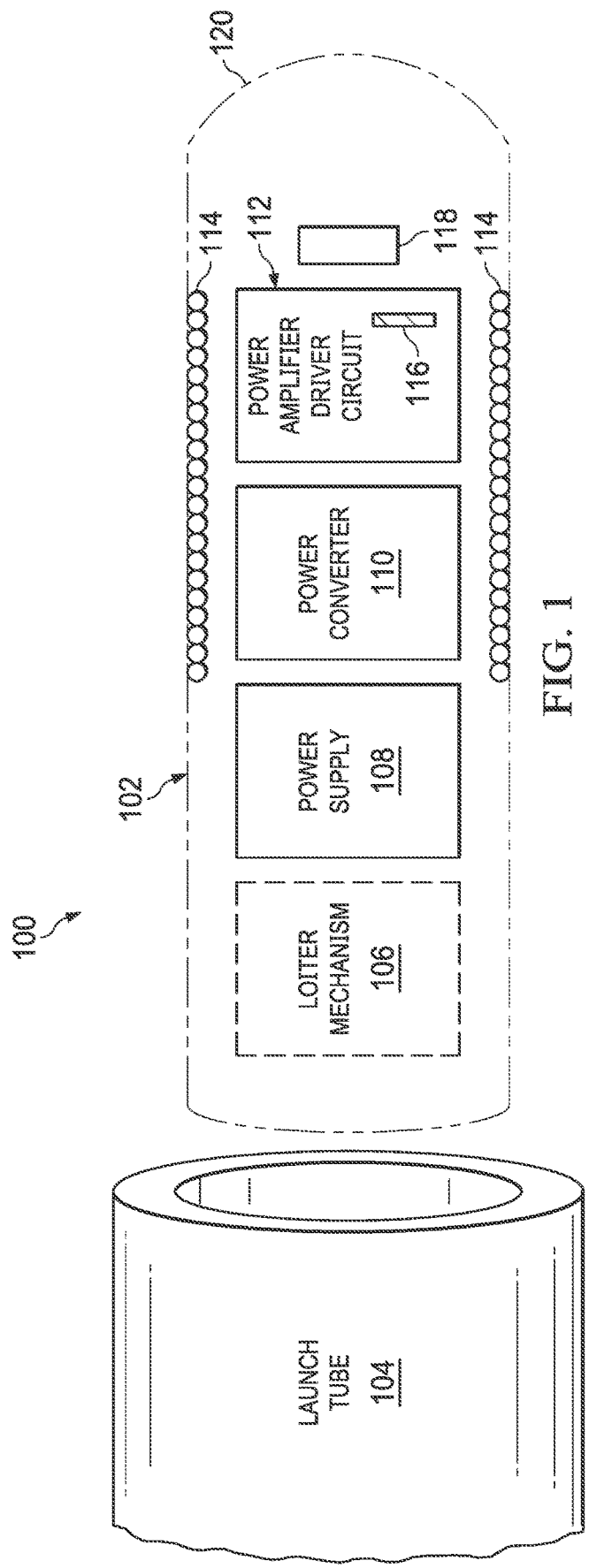
FIG. 1 illustrates an example embodiment of a directed energy device capable of disrupting air-based predatory threats in accordance with this disclosure.

FIGS. 1 through 8, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, conventional approaches for combatting rogue unmanned aerial vehicles (UAVs) fall short in various ways. This disclosure provides various approaches for generating and delivering electromagnetic pulses capable of interfering with or disrupting electronics used for control, steering, communication, or other functions of UAVs. For example, in some embodiments, various mechanisms are disclosed for launching one or more relatively small cartridges (also referred to as capsules) each containing a directed energy device into the air and in the flight path of one or more UAVs. The cartridges can be launched in any suitable manner, such as by using a handheld device or a turret-mounted tube. Parachutes or other "loiter" mechanisms can help to hold the cartridges within the flight path of the UAVs.

Each cartridge includes or is associated with a directed energy device configured to impart an electromagnetic disturbance in the surrounding area, which can have a disruptive or disabling effect on a UAV's steering, velocity, or other essential control aspects. For example, each cartridge can include a "capacitive-discharge" circuit or other circuit that pumps out electromagnetic pulses of interference into a UAV's radio frequency operational spectrum. Typical electromagnetic pulse-generating devices can deliver high current pulses designed to overload RF receiver inputs or other circuits.

The loiter mechanisms used in some embodiments of the cartridges help to hold the directed energy devices in the air for longer periods of time. This increases the likelihood that the electromagnetic disturbances created by the directed energy devices will successfully disrupt or disable any target UAVs. Any suitable loiter mechanisms can be used, such as parachutes, rotors, or umbrella-like attachments. The loiter mechanisms can simply slow the descent of the cartridges, or the loiter mechanisms can actively attempt to hold the cartridges in the air. One cost-effective benefit of these approaches is that they need not include conventional electro-optical or infrared pointing or targeting techniques to direct the cartridges after launch.

During use, a field operator or other user can deploy the cartridges ahead of and above the flight path of an intruding UAV, which can help to impart maximal electromagnetic disturbance to the UAV. Deploying the cartridges as close as possible to potential targets helps to overcome significant losses that are inherent with ground-based transmission approaches (since loss is inverse to distance squared). In addition, as a general guideline, it is less expensive to produce a series of relatively low-power transmitters (the directed energy devices) than to fabricate a single transmitter with the same combined power output. These factors indicate that a significant cost-performance benefit may be obtained using the described approaches.

In some embodiments, the launch mechanism used for one or more cartridges can be self-contained and can resemble a large-diameter shotgun, with a manual or automatic feed mechanism for the cartridges. In particular embodiments, the launcher may use carbon dioxide or nitrogen gas for delivering the cartridges. In other embodiments, the launch mechanism used for one or more cartridges can represent a shoulder launcher. Of course, any other suitable mechanisms can be used to launch the cartridges, such as other handheld or portable launchers or turret-mounted tubes or other devices attached to fixed or movable structures.

Note that in other embodiments, cartridges with directed energy devices can be carried by a hardened UAV and maneuvered to intercept rogue UAVs, or directed energy devices can be fixed on the ground (possibly in multiple locations around one or more protected areas). In those embodiments, the loiter mechanisms can be omitted, and launching of cartridges containing directed energy devices may not be needed. In general, one or more directed energy devices can be used in any suitable manner to attempt to disrupt or disable one or more UAVs.

FIG. 1 illustrates an example embodiment of a directed energy device 100 capable of disrupting air-based predatory threats in accordance with this disclosure. More specifically, FIG. 1 illustrates an example internal component layout of the directed energy device 100. As shown in FIG. 1, the directed energy device 100 includes or resides within a capsule 102, which can fit within and be launched from a launch tube 104. The capsule 102 generally operates to contain other components of the directed energy device 100, including those components used to disrupt or disable one or more UAVs. The capsule 102 can be formed from any suitable material(s), such as metal or plastic. The capsule 102 can also be formed in any suitable manner. In addition, the capsule 102 can have any suitable size, shape, and dimensions.

An exit portion of the launch tube 104 is shown in FIG. 1. The launch tube 104 can be formed from any suitable material(s), such as metal or plastic. The launch tube 104 can also be formed in any suitable manner. Further, the launch tube 104 can represent a stand-alone launcher used to launch one or more directed energy devices 100, such as a shoulder launcher, large-diameter shotgun, or other handheld or portable device. The launch tube 104 can also represent part of a larger structure, such as a tube mounted on a turret that can rotate and elevate the launch tube 104 to aim the tube. Moreover, any suitable mechanism can be used to launch a directed energy device 100 from the launch tube 104, such as compressed air (like carbon dioxide or nitrogen gas) or propellant combustion. In addition, the launch tube 104 can have any suitable size, shape, and dimensions.

In this example, the directed energy device 100 includes a loiter mechanism 106. After launch, the loiter mechanism 106 can be deployed or otherwise used to increase the loiter time of the directed energy device 100 in the air. For example, in some embodiments, the loiter mechanism 106 represents a parachute or umbrella-like attachment that is deployed after launch to slow the descent of the directed energy device 100 towards the ground. In other embodiments, the loiter mechanism 106 represents a propeller-type rotor that is deployed or used after launch to slow the descent of the directed energy device 100 towards the ground or to attempt to maintain the directed energy device 100 in the air for some desired amount of time.

Other suitable loiter mechanisms 106 can be attached to or positioned within the directed energy device 100. This loitering allows for an extended time for engagement of a magnetic B-field created by the directed energy device 100 to inductively couple into a UAV's electronics (such as those used by the UAV for communication, navigation, steering, etc.). The loiter mechanism 106 includes any suitable structure configured to slow the descent of a directed energy device or to maintain a position of a directed energy device in the air.

The directed energy device 100 also includes a power supply 108. The power supply 108 is used by other components of the directed energy device 100 to generate a magnetic B-field that disrupts or disables any nearby UAVs. The power supply 108 includes any suitable source of electrical power. In some embodiments, the power supply 108 includes one or more batteries configured to provide pulses at high amperage. In particular embodiments, the power supply 108 includes one or more batteries configured to provide 9-18 VDC or other input voltage. Note, however, that any other suitable source of electrical power can be used here, such as one or more supercapacitors or other electrical storage device(s).

The directed energy device 100 further includes a power converter 110. The power converter 110 generally operates to receive an input voltage from the power supply 108 and generate a different output voltage. For example, in some embodiments, the power converter 110 can receive a direct current (DC) input voltage and convert the DC input voltage into a DC output voltage having a different form, such as a higher or lower voltage level. As described below, the power converter 110 supplies power so that a high circulating current can develop within part of the directed energy device 100, and the power converter 110 can be configured to provide an adequately large output voltage. As a particular example, the power converter 110 can receive a 9-18 VDC input voltage from the power supply 108 and generate an output voltage of 400 VDC or more. The power converter 110 includes any suitable structure configured to receive an input voltage and generate a different output voltage, such as a step-up or step-down converter.

In addition, the directed energy device 100 includes a power amplifier driver circuit 112 and a first inductor (namely an inductive near-field element 114). In some embodiments, the power amplifier driver circuit 112 drives one or more field effect transistors (FETs) or other transistor switches to create a varying electrical current through a second inductor (namely an inductive coil 116). The inductive near-field element 114 and a capacitor 118 form a resonant tank circuit. A source current switched at a high frequency and high voltage (such as the output of the power converter 110 as switched by the power amplifier driver circuit 112) can be mutually inducted into the tank circuit from the inductive coil 116 so that a high circulating current develops in the tank circuit. In other embodiments, the power amplifier driver circuit 112 drives one or more FETs or other transistor switches to create a high circulating current in the tank circuit in other ways (without mutual inductance via an inductive coil 116). However the high circulating current is created, this leads to the generation of a magnetic B-field that can be used to engage any nearby UAV's electronics.

The power amplifier driver circuit 112 includes any suitable structure configured to drive one or more transistor switches, such as a Class E FET driver circuit. The inductive near-field element 114 represents any suitable inductive structure configured to generate a magnetic B-field that can be used to engage at least one UAV's electronics, such as a conductive coil wound within an interior of the capsule 102. The inductive near-field element 114 can have any suitable inductance, such as an inductance of approximately 7 µH. The inductive coil 116 represents any suitable inductive structure used to mutually induct or otherwise create a variable current flow through an inductive near-field element, such as a smaller coil (compared to the inductive near-field element) located within or coupled to a power amplifier driver circuit. The inductive coil 116 can have any suitable inductance, such as an inductance of approximately 0.15 pH to approximately 0.5 pH.

The capacitor 118 represents any suitable capacitive structure used to form a tank circuit with an inductive near-field element and can have any suitable capacitance. Since the capacitor 118 is used in a tank circuit designed to resonate, the tank circuit has repeated voltage peaks and current peaks, and the capacitor 118 can have a high breakdown voltage and a very low equivalent series resistance (ESR) in order to reduce or minimize losses due to current flow.

Example types of capacitors that can be used here include capacitors formed from mica or Teflon or capacitors that use air or a vacuum. In particular embodiments, the capacitor 118 can be variable or adjustable in order to allow adjustments to the resonant frequency of the tank circuit so that the resonant frequency of the tank circuit matches the drive frequency at which the power amplifier driver circuit 112 drives the one or more transistor switches. This can also be done to adjust size of the space in which the directed energy device 100 can effectively disrupt or disable one or more UAVs. Note, however, that the use of an adjustable capacitor 118 is not required, and other mechanisms can be used to match the resonant frequency of the tank circuit and the drive frequency of the power amplifier driver circuit 112. For instance, the drive frequency of the power amplifier driver circuit 112 can be adjusted electronically to match the resonant frequency of the tank circuit.

In this example, the capsule 102 of the directed energy device 100 includes a rounded nose 120 to help reduce air resistance throughout launch and travel. Of course, the nose of the capsule 102 can have any other suitable shape, such as a more pointed nose. Also, as discussed above, the directed energy device 100 can be used in various ways, such as in a shoulder launcher, a large-diameter shotgun, or a turret launcher. The size and shape of the directed energy device 100 can vary depending on how the directed energy device 100 is used. In particular embodiments, the directed energy device 100 is approximately 3.0 inches in diameter and approximately 6.0 inches in length with a rounded nose 120. Of course, other embodiments of the directed energy device 100 can also be used.

Through its unique design and operation, the directed energy device 100 helps to provide protection against rogue drones or other UAVs by enabling the disruption or disabling of the electronics used in the UAV(s). As a result, the directed energy device 100 can be used to help protect against threats to subways, airports, sport gatherings, soft targets, military sites, power generating sites, and other locations. Also, directed energy devices 100 can help to provide protection against a single UAV or a swarm of UAVs, and directed energy devices 100 can be small enough to be deployed on multiple platforms around or in a given area. Further, the directed energy devices 100 can generally represent low-cost items and can often be reused, providing a low-cost solution to UAV protection. In addition, the directed energy devices 100 provide a disruptive or disabling effect on UAVs in a non-explosive manner (which can be important when disabling UAVs carrying explosives, incendiary devices, or biological, chemical, or radiological agents) as well as in a non-radiating manner (which can help to limit damage to nearby equipment).

Directed energy devices 100 can find use in a number of scenarios. For example, directed energy devices 100 can be strategically placed around public events, such as around sports stadiums or other large venues. As another example, directed energy devices 100 can be positioned around "exclusion zones" containing military bases, nuclear reactors or other power generating sites, or other important or sensitive areas. The directed energy devices 100 can even be useful in applications used to counter mines or improvised explosive devices (IEDs) having electronics that can be disrupted or disabled by the directed energy devices 100. This provides a unique and attractive technique to thwart terrorist threats or other threats to civilian and military targets.

Although FIG. 1 illustrates one example embodiment of a directed energy device 100 capable of disrupting air-based predatory threats, various changes may be made to FIG. 1. For example, the directed energy device 100 can be used in any suitable environments to combat any desired UAVs or other targets. Also, electrical systems or components of the directed energy device 100 can be implemented in a number of ways, including (but not limited to) those discussed below. In addition, a number of other features can be used to facilitate aiming and launch of the directed energy device 100. For instance, a laser range finder can be provided on the launch mechanism (such as on the launch tube 104) to identify an estimated range to a rogue UAV or other target. As another example, a blinking light emitting diode (such as a green LED) can be provided on a directed energy device 100 to provide line-of-sight feedback enhancement, such as for nighttime usage. As a third example, a directed energy device 100 can include an embedded glue trap or other structure on the outside of the capsule 102 that facilitates physical attachment to a UAV or other target in the event that the directed energy device 100 actually strikes the UAV or other target.

Figure 2:
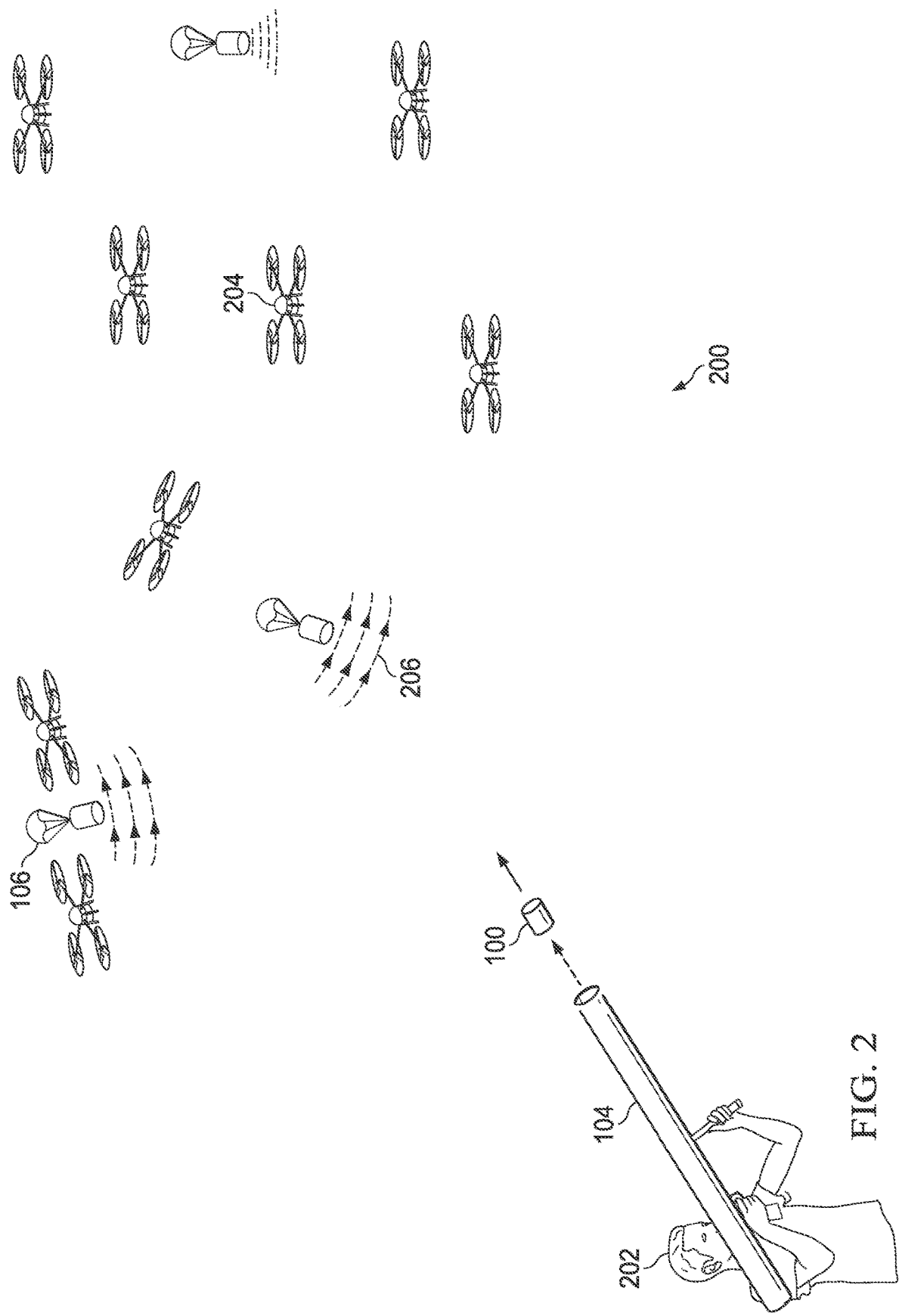
FIG. 2 illustrates a first example environment where a directed energy device capable of disrupting air-based predatory threats can be used in accordance with this disclosure.

FIG. 2 illustrates a first example environment 200 where a directed energy device capable of disrupting air-based predatory threats can be used in accordance with this disclosure. As shown in FIG. 2, a user 202 can launch one or more directed energy devices 100 using the launch tube 104. Each directed energy device 100 can be directed towards a drone 204 or other UAV or towards a swarm of drones 204 or other UAVs. It may be necessary or desirable to launch multiple directed energy devices 100 towards the drone 204 or swarm of drones 204. As noted above, each directed energy device 100 can be gas-propelled or propelled in any other suitable manner.

One or more directed energy devices 100 ideally get within close proximity of each predator drone 204 in order to disrupt or disable the drone 204. For example, launching a directed energy device 100 both ahead of and above a predator drone 204 (at the apex of the flight path of the directed energy device 100) can strongly increase the likelihood of disrupting or disabling the drone 204. The loiter mechanism 106 used with each directed energy device 100 increases the loiter time of that directed energy device 100 in the air. This loitering allows for an extended time for engagement of a B-field 206 created by the directed energy device 100 to inductively couple into the predator drone's electronic controls. This can help to disrupt or disable the drone's controls used for communication, navigation, steering, or other functions.

In particular embodiments, directed energy devices 100 can achieve a launch velocity of approximately 150 feet per second and enable an altitude intercept of up to approximately 300 feet, although other launch velocities and altitude intercepts can occur. In some embodiments, velocity adjustments can be made by a field operator or other user 202, such as by turning a dial or adjusting another control of the launch tube 104 to control the launching of the directed energy devices 100. In some cases, the launch tube 104 can include a manual or automatic feed mechanism for the directed energy devices 100, allowing multiple directed energy devices 100 to be launched from the launch tube 104 quickly.

As can be seen here, the directed energy devices 100 operate by attempting to inductively couple into a drone's electronics to disrupt or disable the drone 204. Collateral damage can be kept to a minimum due to the non-explosive and non-radiating nature of the directed energy devices 100, thereby enabling a potential intact recovery of a disabled drone 204. Also, each directed energy device 100 can fully discharge before reaching the ground so that no unintentional inductive coupling occurs on the ground with other devices or systems. In addition, spent/used directed energy devices 100 can be collected, recharged, and potentially re-used to minimize recurring costs.

Figure 3:
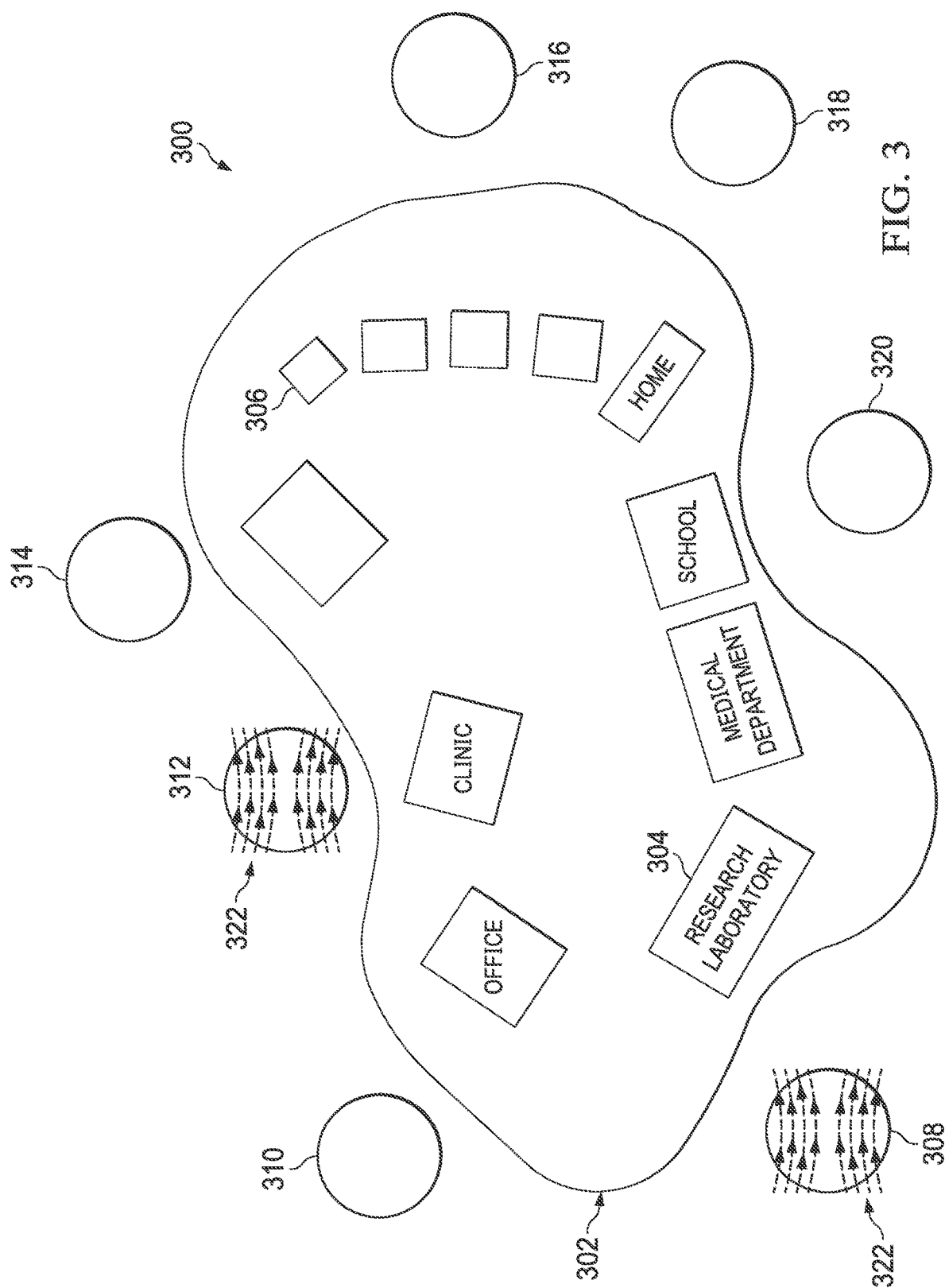
FIG. 3 illustrates a second example environment where a directed energy device capable of disrupting air-based predatory threats can be used in accordance with this disclosure.

FIG. 3 illustrates a second example environment 300 where a directed energy device capable of disrupting air-based predatory threats can be used in accordance with this disclosure. As shown in FIG. 3, the environment 300 includes an exclusion perimeter 302, which generally identifies the boundary of an area to be protected against predator drone or drone swarm attacks. The exclusion perimeter 302 can encompass one or more soft targets 304 or one or more homes 306. The soft targets 304 in this example include buildings that house offices, clinics, research laboratories, medical facilities, and schools. However, the soft targets 304 can include any other or additional facility or facilities.

In this example, larger directed energy devices 308-320 act as a stand-alone defense rather than being launched into the air. These stand-alone directed energy devices 308-320 can, for example, sit on tall standoffs or poles, tall buildings, or other tall structures and create magnetic B-fields 322 used to intercept one or more drones or other UAVs in order to disrupt or disable the one or more UAVs. Intercept parameters can be tailored for these types of embodiments. Ideally, the directed energy devices 308-320 prevent entry of any drones or other UAVs past the exclusion perimeter 302.

These stand-alone directed energy devices 308-320 can be activated in any suitable manner. For example, the directed energy devices 308-320 can be remotely or automatically activated, such as based on a perimeter section that may be breached by one or more drones or other UAVs (which can be detected by radar or other detection systems). The directed energy devices 308-320 can also be triggered manually, such as based on manual observation of one or more incoming drones or other UAVs.

The directed energy devices 308-320 can have the same general form as the directed energy device 100 shown in FIG. 1, although various modifications can be made to support the use of the directed energy devices 308-320 in the environment 300 (such as by making the directed energy devices 308-320 larger and more powerful). For example, the capsules 102 of the directed energy devices 308-320 can have a different form factor, such as larger spherical capsules or capsules of other larger shapes. As another example, the directed energy devices 308-320 can have the option of being powered from 110 VAC or other alternating current (AC) power sources, thereby allowing the directed energy devices 308-320 to produce stronger B-field effects during flyovers of drones or other UAVs. This may be needed or desired since the directed energy devices 308-320 here are not launched to be in close proximity to rogue drones or other UAVs. As yet another example, the directed energy devices 308-320 can include mounting brackets or other mounting hardware allowing the directed energy devices 308-320 to be mounted to standoffs, poles, buildings, or other structures.

FIG. 4 illustrates a third example environment 400 where a directed energy device capable of disrupting air-based predatory threats can be used in accordance with this disclosure. As shown in FIG. 4, a friendly UAV (referred to as a "workhorse" drone 402) is used to pull a plurality of directed energy devices 404. In this example, the workhorse drone 402 pulls ten directed energy devices 404 and the directed energy devices 404 are spherical, although other numbers and shapes of the directed energy devices 404 can be used.

The workhorse drone 402 can drag the directed energy devices 404 through the environment 400, such as by using a tether assembly 406. The tether assembly 406 can incorporate electrical conductors or other structures to provide each directed energy device 404 with electrical power. As a particular example, the tether assembly 406 can include a copper or other conductive wire harness 408 that is fed by the workhorse drone 402. Alternatively, each of the directed energy devices 404 can include its own power supply as described above. Thus, the directed energy devices 404 can have any of the designs discussed above, or the directed energy devices 404 can have designs similar to those discussed above but modified to support the receipt of operating power from a remote source.

This embodiment is designed to allow the workhorse drone 402 to maneuver its way through the air space of a swarm of predator drones 410, making certain that the associated B-field 412 of at least one directed energy device 404 creates a disruptive or disabling inductive effect to the closest predator drone(s) 410. The desired result is to decommission all predator drones 410 in the swarm to earth ground 414. In order to prevent the directed energy devices 404 from disrupting or disabling the workhorse drone 402 itself, the workhorse drone 402 can be hardened against magnetic coupling, such as through appropriate shielding of its electrical components.

The directed energy devices 404 can have the same general form as the directed energy device 100 shown in FIG. 1, although various modifications can be made to support the use of the directed energy devices 404 in the environment 400. For example, the capsules 102 of the directed energy devices 404 can have a different form factor, such as a spherical shape. As other examples, the directed energy devices 404 can include mounting hardware allowing the directed energy devices 404 to be mounted or otherwise connected to the tether assembly 406 and optionally electrical contacts allowing the directed energy devices 404 to receive electrical energy through the wire harness 408.

Although FIGS. 2 through 4 have illustrated example environments where at least one directed energy device capable of disrupting air-based predatory threats can be used, various changes may be made to FIGS. 2 through 4. For example, the directed energy devices 100, 308-320, 404 can be used in any other suitable environments to combat any suitable threats. Also, while the directed energy devices 100, 308-320, 404 are often described above as being used against drones, the directed energy devices 100, 308-320, 404 can be used to provide protection against any other UAVs.

Figure 5:
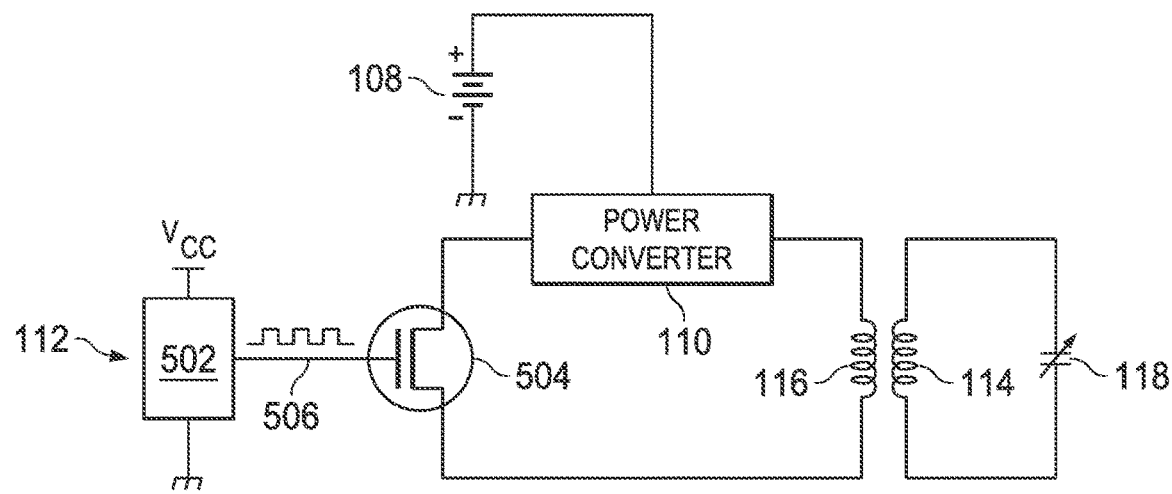
FIGS. 5 through 7 illustrate example embodiments of components within a directed energy device capable of disrupting air-based predatory threats in accordance with this disclosure.
Figure 6:
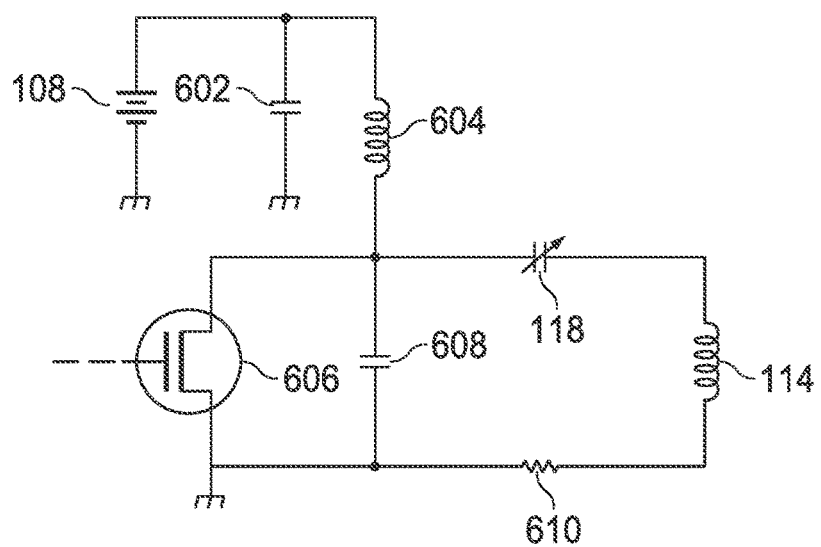
Figure 7:
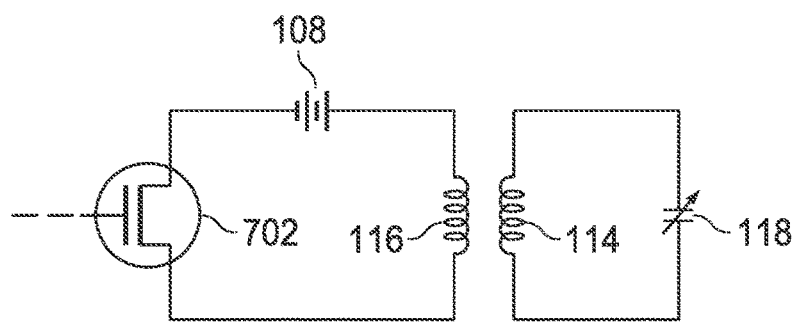

FIGS. 5 through 7 illustrate example embodiments of components within a directed energy device capable of disrupting air-based predatory threats in accordance with this disclosure. In particular, FIGS. 5 through 7 illustrate example embodiments of components shown as residing within the directed energy device 100 of FIG. 1. However, the same or similar components can be used in the directed energy devices 308-320 of FIG. 3 or the directed energy devices 404 of FIG. 4.

FIG. 5 depicts an example embodiment of components in a directed energy device 100. In this example, an on-board frequency or clock circuit 502 with a variable duty cycle drives a transistor switch 504. The transistor switch 504 is coupled in series with the power converter 110 and the inductive coil 116. The circuit 502 is coupled to ground and to receive a supply voltage $V_{CC}$, and the circuit 502 outputs a drive signal 506 with a variable duty cycle.

The drive signal 506 is provided to a gate of the transistor switch 504. The drive signal 506 contains pulses that cause the transistor switch 504 to repeatedly become conductive and non-conductive, thereby creating a variable current through the inductive coil 116. This variable current causes the inductive coil 116 to create a varying magnetic field that couples into the inductive near-field element 114. The inductive near-field element 114 and the capacitor 118 form a resonant tank circuit, and the current through the inductive coil 116 is mutually inducted into the tank circuit. This creates a high circulating current in the tank circuit, causing the inductive near-field element 114 to generate a magnetic B-field used to disrupt or disable any nearby UAV's electronics.

There is typically no shielding of the electronics in a drone or other rogue UAV from the directed energy device's high slew dB/dT near-field generated by the inductive near-field element 114. The produced inductive magnetic field is designed to result in the disabling or destabilization of the predator drone or other UAV's electronics. This can occur through resetting of the target's microprocessor, resetting of the target's counters, corrupting of control circuit information, etc. While some absorbing materials such as ferrite materials can theoretically be used to provide protection against the produced inductive magnetic field, those materials are heavy and not suitable for use in rogue UAVs. The use of superconductive materials might also conceivably provide protection against the produced inductive magnetic field, but rogue UAVs typically lack superconductive materials, and the ability of superconductive materials to provide protection against the produced inductive magnetic field is not a certainty.

The most susceptible components of a drone or other UAV may be those with low voltage and current requirements, such as solid-state devices, integrated circuits, semiconductor devices, digital computers, digital circuitry, alarm systems, and electronic sensors. Generally, as the size of the device decreases, its ability to absorb these current spikes decreases, resulting in an increased susceptibility to the directed energy device's B-field. Creating a rapidly-varying current (such as 50-100 Joules of high dI/dT current) through the inductive near-field element 114 can disrupt or disable a drone or other UAV's electronics by producing a fast rising dB/dT field and subsequent electric field in an incident conductor (the drone or other UAV's electronic components).

The circuit 502 includes any suitable structure configured to generate a suitable clock signal or other drive signal. The transistor switch 504 includes any suitable structure for selectively forming and breaking an electrical connection, such as a quantum field effect transistor (QFET), other FET, or other transistor. Note that the transistor switch 504 can be capable of handling large voltage levels and voltage spikes, although metal-oxide varistors (MOVs) or other protective circuits can be used to reduce the voltage spikes at the transistor switch 504. One example of a transistor switch 504 that can potentially be used here is the IXTA02N450HV high-voltage power MOSFET from INYS CORP. In some embodiments, the circuit 502 and the transistor switch 504 form at least part of a Class E amplifier network. Also, the circuit 502 and the transistor switch 504 can operate at any suitable frequencies, such as at a frequency below 1 MHz for launched or pulled directed energy devices 100, 404 or higher frequencies for larger directed energy devices 308-320. In particular embodiments, the circuit 502 and the transistor switch 504 can operate in frequencies not exceeding several tens of megahertz. Note that the capacitor 118 in FIG. 5 is shown as being variable or adjustable, although as noted above this is not required.

FIGS. 6 and 7 illustrate alternative embodiments that can be used in the directed energy device 100 for generating pulses. As shown in FIG. 6, a capacitor 602 is coupled in parallel with the power supply 108, and both the power supply 108 and the capacitor 602 are coupled to an inductor 604. The inductor 604 is also coupled to the capacitor 118, a transistor switch 606, and a capacitor 608. The transistor switch 606 and the capacitor 608 are coupled in parallel with each other, and the capacitor 118 is coupled in series with the inductive near-field element 114 and a resistor 610. The capacitor 118 and the inductive near-field element 114 here form a series resonant circuit, and the transistor switch 606 can be selectively opened and closed across the capacitor 608 to create a high circulating current in the series resonant circuit. A gate of the transistor switch 606 can be coupled to an on-board frequency or clock circuit (such as the circuit 502 described above) to control the opening and closing of the transistor switch 606.

Note that the design of the directed energy device 100 shown in FIG. 6 includes a modified version of a Class E amplifier. In a normal Class E amplifier, the load being powered by the amplifier would be represented by the resistor 610. In this example, however, the focus is on supplying a variable current to the inductive near-field element 114. The inductive near-field element 114 is made physically large to extend its B-field outward, unlike in a conventional Class E amplifier. Note that this approach does not rely on mutual inductance of the current through an inductive coil 116 into the inductive near-field element 114.

Each capacitor 602 and 608 includes any suitable capacitive structure, such as a standard capacitor or a supercapacitor. Each capacitor 602 and 608 can also have any suitable capacitance. The inductor 604 includes any suitable inductive structure having any suitable inductance. The transistor switch 606 includes any suitable structure for selectively forming and breaking an electrical connection, such as a QFET, other FET, or other transistor. The resistor 610 includes any suitable resistive structure and can have any suitable resistance.

As shown in FIG. 7, a transistor switch 702 is coupled in series with the power supply 108 and the inductive coil 116. The inductive near-field element 114 is coupled in parallel with the capacitor 118, forming a parallel resonant circuit. The transistor switch 702 can be selectively opened and closed to create a varying current through the inductive coil 116, and the varying current can be mutually inducted to the parallel resonant circuit. The gate of the transistor switch 702 can be coupled to an on-board frequency or clock circuit (such as the circuit 502 described above) to control the opening and closing of the transistor switch 702. This approach is similar to that shown in FIG. 5, but the power converter 110 is omitted. The transistor switch 702 includes any suitable structure for selectively forming and breaking an electrical connection, such as a QFET, other FET, or other transistor.

As can be seen here, there are various ways in which circuitry can be designed to cause the inductive near-field element 114 to generate a magnetic B-field used to disrupt or disable electronics of any nearby UAVs. In general, any suitable series and/or parallel resonant circuit(s) can be used in the directed energy device 100 to generate a magnetic B-field used to disrupt or disable electronics of one or more UAVs. Further, in particular embodiments, any of these circuits can support inductor coils that are radially distributed around a central tuning capacitor.

Although FIGS. 5 through 7 illustrate example embodiments of components within a directed energy device capable of disrupting air-based predatory threats, various changes may be made to FIGS. 5 through 7. For example, while described as being used in the directed energy device 100, the components shown in FIGS. 5 through 7 can be used in the directed energy devices 308-320 or the directed energy devices 404. Also, electrical systems or components of the directed energy devices 100, 308-320, 404 can be implemented in a number of ways to generate pulses, and the specific implementations described above are examples only.

Figure 8:
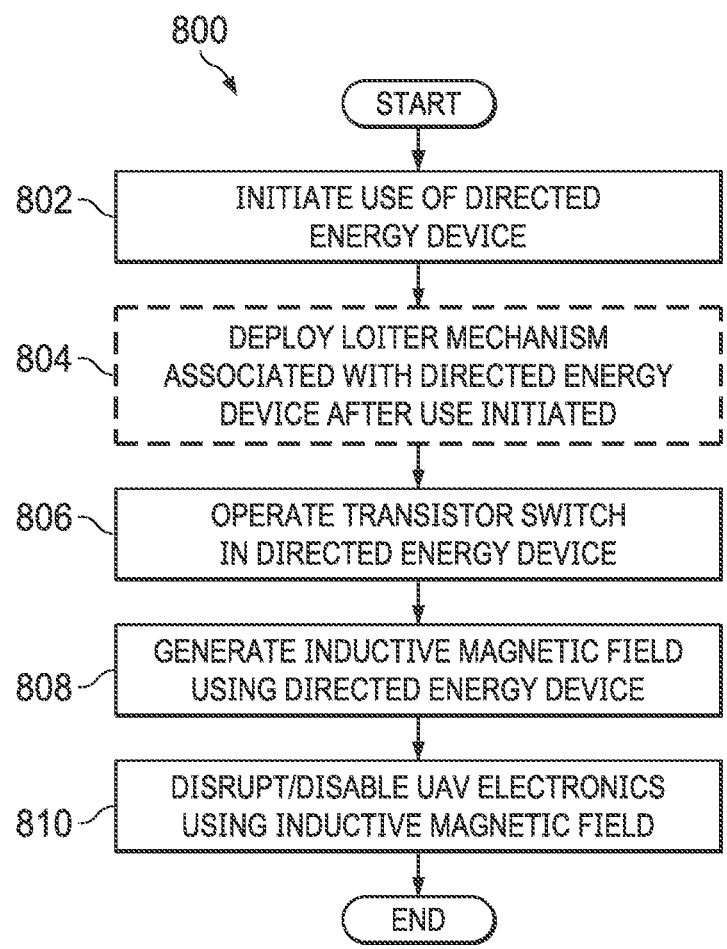
FIG. 8 illustrates an example method for disrupting air-based predatory threats using a directed energy device in accordance with this disclosure.

FIG. 8 illustrates an example method 800 for disrupting air-based predatory threats using a directed energy device in accordance with this disclosure. For ease of explanation, the method 800 of FIG. 8 is described as being performed using one or more directed energy devices 100, 308-320, 404 in the environments 200-400 of FIGS. 2 through 4. However, the method 800 can involve the use of any suitable directed energy device(s) in any suitable environment.

As shown in FIG. 8, use of at least one directed energy device is initiated at step 802. This can include, for example, a user 202 launching one or more directed energy devices 100 from a launch tube 104. This can also include activating one or more directed energy devices 308-320, such as in response to detection of one or more incoming drones or other UAVs. This can further include launching or maneuvering a workhorse drone 402 carrying one or more directed energy devices 404 towards one or more UAVs.

A loiter mechanism associated with each directed energy device can optionally be deployed after use of the directed energy device is initiated at step 804. This can include, for example, deploying a parachute, umbrella-like attachment, rotor, or other loiter mechanism 106 from the capsule 102 of each directed energy device 100. Note, however, that this step is optional if the directed energy device is not launched. For instance, no loiter mechanism may be needed for the directed energy devices 308-320 or for the directed energy devices 404.

At least one transistor switch within each directed energy device is operated at step 806, and an inductive magnetic field is generated using each directed energy device at step 808. This can include, for example, the power amplifier driver circuit 112 operating a transistor switch 504 or 702 to generate a varying electrical current through the inductive coil 116, which can be mutually inducted into a resonant tank circuit or otherwise provided from the inductive coil 116 to the tank circuit such that a high circulating current develops in the tank circuit. This can alternatively include the power amplifier driver circuit 112 operating a transistor switch 602 to otherwise generate a high circulating current in a resonant tank circuit. The tank circuit includes the inductive near-field element 114 and the capacitor 118.

The inductive magnetic field is used to disrupt or disable at least part of the electronics of one or more drones or other UAVs at step 810. This can include, for example, the inductive magnetic field from the inductive near-field element 114 inductively coupling into the one or more UAVs' electronics. As particular examples, this can include the inductive magnetic field from the inductive near-field element 114 inductively coupling into the one or more UAVs' electronics in order to reset a UAV's microprocessor, reset one or more of the UAVs' counters, or corrupt the UAV's control circuit information. Ideally, this disrupts or disables the one or more UAVs while causing little if any adverse effects on nearby devices or systems.

Although FIG. 8 illustrates one example of a method 800 for disrupting air-based predatory threats using a directed energy device, various changes may be made to FIG. 8. For example, while shown as a series of steps, various steps in FIG. 8 can overlap, occur in parallel, occur in a different order, or occur any number of times.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a capsule configured to be launched or carried towards an unmanned aerial vehicle (UAV); and
   a directed energy device within or carried by the capsule, the directed energy device comprising:
      a first inductor configured to generate a magnetic field that is able to disable or destabilize one or more electronics of the UAV;
      a power supply configured to provide a supply voltage;
      a power converter configured to receive the supply voltage and generate an output voltage different from the supply voltage; and
      a power amplifier driver circuit configured to generate a drive signal for a transistor switch, wherein operation of the transistor switch causes generation of the magnetic field based on the output voltage.

2. The apparatus of claim 1, further comprising:
   a loiter mechanism configured to maintain a position of the capsule or to slow a descent of the capsule after launch and prior to engagement with the UAV in order to hold the apparatus within a flight path of the UAV.

3. The apparatus of claim 2, wherein the loiter mechanism comprises at least one of: a rotor, an umbrella, and a parachute.

4. The apparatus of claim 1, wherein the apparatus is reusable.

5. The apparatus of claim 1, wherein the first inductor and a capacitor form a resonant tank circuit.

6. The apparatus of claim 5, wherein the directed energy device further comprises a second inductor through which a varying electrical current is able to flow and be mutually inducted into the resonant tank circuit.

7. The apparatus of claim 1, wherein:
   the capsule is configured to be carried towards the UAV by a second UAV; and
   the apparatus further comprises a tether configured to couple the capsule to the second UAV.

8. The apparatus of claim 7, wherein the directed energy device is configured to receive electrical power through the tether from the second UAV.

9. A system comprising:
   a plurality of apparatuses each comprising:
      a capsule configured to be launched towards an unmanned aerial vehicle (UAV); and
      a directed energy device within or carried by the capsule, the directed energy device comprising:
         a first inductor configured to generate a magnetic field that is able to disable or destabilize one or more electronics of the UAV;
         a power supply configured to provide a supply voltage;
         a power converter configured to receive the supply voltage and generate an output voltage different from the supply voltage; and
         a power amplifier driver circuit configured to generate a drive signal for a transistor switch, wherein operation of the transistor switch causes generation of the magnetic field based on the output voltage; and
   a launcher configured to launch the capsules, the launcher comprising a tube.

10. The system of claim 9, wherein each apparatus further comprises:
a loiter mechanism configured to maintain a position of the capsule or to slow a descent of the capsule after launch and prior to engagement with the UAV in order to hold the apparatus within a flight path of the UAV.

11. The system of claim 10, wherein the loiter mechanism comprises at least one of: a rotor, an umbrella, and a parachute.

12. The system of claim 9, wherein at least one of the apparatuses is reusable.

13. The system of claim 9, wherein, in each apparatus, the first inductor and a capacitor form a resonant tank circuit.

14. The system of claim 13, wherein the directed energy device of each apparatus further comprises a second inductor through which a varying electrical current is able to flow and be mutually inducted into the resonant tank circuit.

15. A system comprising:
a first unmanned aerial vehicle (UAV); and
one or more apparatuses each comprising:
  a capsule configured to be carried by the first UAV towards a second UAV; and
  a directed energy device within or carried by the capsule, the directed energy device comprising:
    a first inductor configured to generate a magnetic field that is able to disable or destabilize one or more electronics of the second UAV;
    a power supply configured to provide a supply voltage;
    a power converter configured to receive the supply voltage and generate an output voltage different from the supply voltage; and
    a power amplifier driver circuit configured to generate a drive signal for a transistor switch, wherein operation of the transistor switch causes generation of the magnetic field based on the output voltage;
wherein the first UAV is maneuverable to engage the second UAV.

16. The system of claim 15, further comprising:
a tether coupling the one or more apparatuses to the first UAV.

17. The system of claim 16, wherein the directed energy device of each apparatus is configured to receive electrical power through the tether from the first UAV.

18. The system of claim 15, wherein, in each apparatus, the first inductor and a capacitor form a resonant tank circuit.

19. The system of claim 18, wherein the directed energy device of each apparatus further comprises a second inductor through which a varying electrical current is able to flow and be mutually inducted into the resonant tank circuit.

20. A method comprising:
moving a reusable directed energy device towards an unmanned aerial vehicle (UAV); and
generating a magnetic field using the directed energy device, the magnetic field able to disable or destabilize one or more electronics of the UAV;
wherein the directed energy device comprises:
  an inductor configured to generate the magnetic field;
  a power supply configured to provide a supply voltage;
  a power converter configured to receive the supply voltage and generate an output voltage different from the supply voltage; and
  a power amplifier driver circuit configured to generate a drive signal for a transistor switch, wherein operation of the transistor switch causes generation of the magnetic field based on the output voltage.

21. The method of claim 20, wherein moving the directed energy device towards the UAV comprises one of:
launching a capsule containing the directed energy device towards the UAV; and
carrying the capsule containing the directed energy device towards the UAV using a different UAV.

* * * * *